(12) United States Patent
Reid et al.

(10) Patent No.: US 7,193,827 B2
(45) Date of Patent: Mar. 20, 2007

(54) SINGLE-SENSOR MICROCONTROLLER-BASED APPROACH FOR GROUND FAULT CIRCUIT INTERRUPTERS

(75) Inventors: Paul A. Reid, Cedar Rapids, IA (US); Randall J. Gass, Oak Park, IL (US); Steve M. Meehleder, Cedar Rapids, IA (US)

(73) Assignee: Square D Company, North Andover, MA (US)

( * ) Notice: Subject to any disclaimer, the term of this patent is extended or adjusted under 35 U.S.C. 154(b) by 469 days.

(21) Appl. No.: 10/687,068

(22) Filed: Oct. 16, 2003

(65) Prior Publication Data

US 2005/0083616 A1    Apr. 21, 2005

(51) Int. Cl.
*H02H 9/08* (2006.01)
*G01R 27/26* (2006.01)
(52) U.S. Cl. .................... 361/42; 324/684; 324/685
(58) Field of Classification Search .................. 361/42; 324/684, 685
See application file for complete search history.

(56) References Cited

U.S. PATENT DOCUMENTS

| | | | | |
|---|---|---|---|---|
| 3,794,884 | A | * | 2/1974 | Sircom ......................... 361/45 |
| 4,053,815 | A | | 10/1977 | Sircom ......................... 361/42 |
| 4,150,411 | A | * | 4/1979 | Howell ......................... 361/45 |
| 4,180,841 | A | * | 12/1979 | Engel ........................... 361/45 |
| 4,542,432 | A | | 9/1985 | Nichols, III et al. |
| 4,550,360 | A | | 10/1985 | Dougherty |
| 4,616,324 | A | * | 10/1986 | Simmel ........................ 702/64 |
| 4,870,532 | A | | 9/1989 | Beatty, Jr. et al. |
| 5,224,011 | A | * | 6/1993 | Yalla et al. ................. 361/93.2 |
| 5,428,495 | A | * | 6/1995 | Murphy et al. ............... 361/85 |
| 5,644,510 | A | * | 7/1997 | Weir .......................... 702/132 |
| 5,675,336 | A | * | 10/1997 | Hakkarainen ............... 341/135 |
| 6,313,642 | B1 | * | 11/2001 | Brooks ........................ 324/547 |
| 6,434,715 | B1 | * | 8/2002 | Andersen ..................... 714/39 |
| 6,538,863 | B1 | | 3/2003 | Macbeth |
| 2001/0002123 | A1 | * | 5/2001 | Banu et al. .................. 341/122 |

* cited by examiner

*Primary Examiner*—Stephen W Jackson
*Assistant Examiner*—Scott Bauer

(57) ABSTRACT

A microcontroller-based temperature compensated circuit for ground-fault circuit interrupter to meet the requirements of UL 943 using a single sensor to detect both ground-fault and grounded-neutral fault conditions in both full-wave and half-wave AC power supplies as part of a ground-fault circuit breaker or a receptacle device.

6 Claims, 6 Drawing Sheets

SINGLE-SENSOR MICROCONTROLLER-BASED APPROACH FOR GROUND FAULT CIRCUIT INTERRUPTERS

BACKGROUND OF THE INVENTION

Existing designs for ground-fault protection devices such as circuit breakers and receptacles typically use an analog circuit and two current sensors to meet the requirements of UL 943. One sensor is needed for detecting the current imbalance characteristic of a ground-fault, and a second sensor is used as part of a dormant oscillator circuit for detecting a grounded-neutral condition that can degrade the ground-fault detection ability. These sensors are required to be of high precision over a wide range of temperatures and to have low part-to-part variance since the analog circuit offers little compensation or calibration abilities. Additionally, the analog approach may not work well if the supply is discontinuous since no non-volatile memory function is available.

SUMMARY OF THE INVENTION

Briefly, the present invention uses the combination of a single low-cost current sensor and a small, low-cost microcontroller, designed for use as part of a ground-fault circuit breaker or receptacle device to meet all the requirements of UL 943 while addressing the issues of existing designs.

According to another embodiment of the invention, the cost is reduced compared to the two-sensor approach by combining the functions of ground-fault detection and grounded-neutral detection into one sensor.

According to yet another embodiment of the invention, a simple temperature measurement and compensation scheme to correct for sensor non-linearities over temperature allows the sensor to be designed to utilize low cost materials and a simple manufacturing process.

Another embodiment of the present invention uses a programmable device that provides for software-based calibration during the electronic assembly process to overcome part-to-part variance in the sensor circuitry. This allows for a wider acceptable tolerance range for the sensor circuit components and reduces the amount of rejected component material.

According to another embodiment of the present invention, an analog memory function is provided to resume a circuit trip condition on a detected fault if power is temporarily lost before the trip circuit has time to activate. This feature allows the circuit of the present invention to operate from a half-wave-rectified or other discontinuous power source.

DETAILED DESCRIPTION OF THE ILLUSTRATED EMBODIMENT

Figure 1:
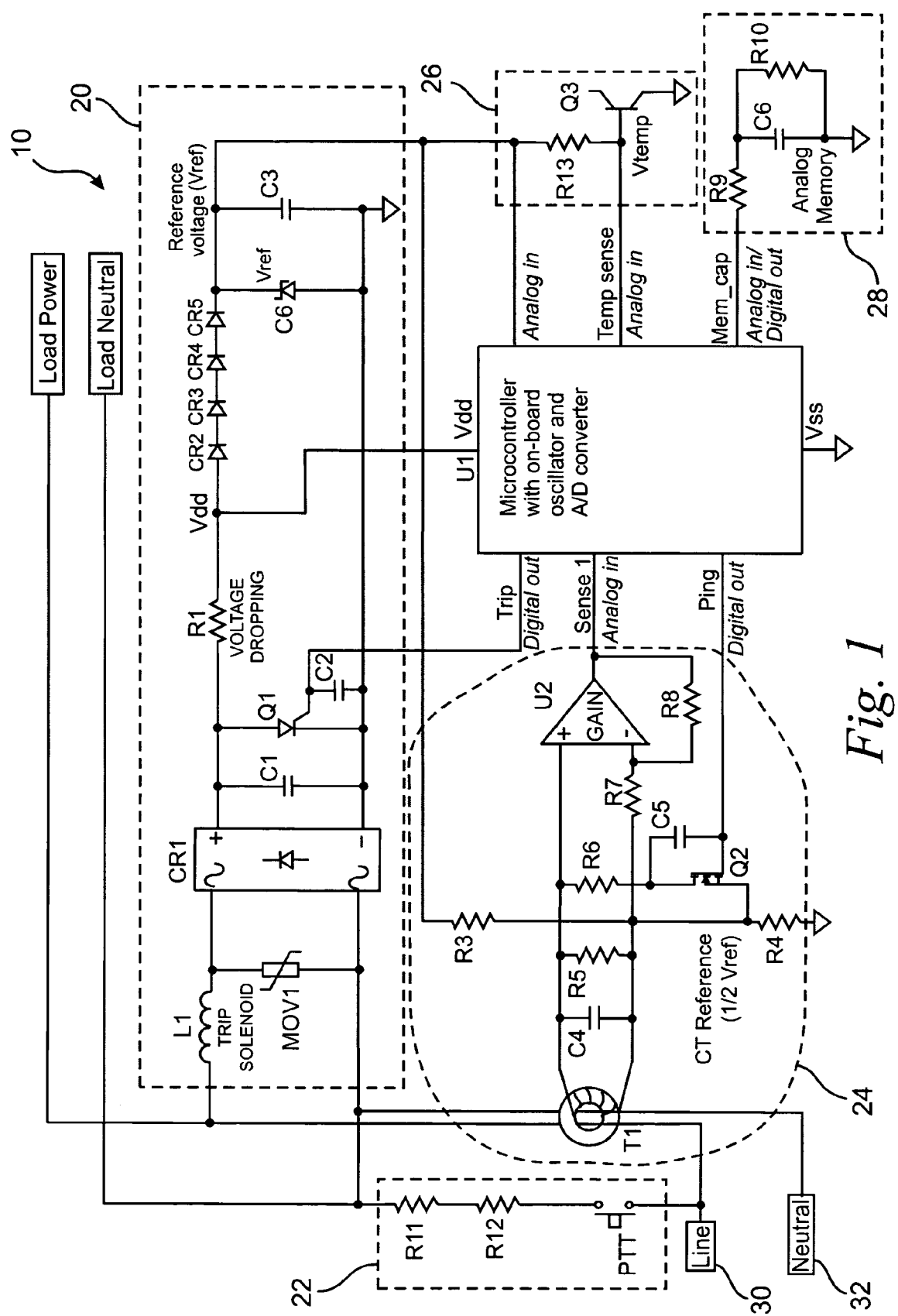
FIG. 1 is a schematic diagram of a ground fault circuit interrupter embodying the invention.

Referring now to the drawings, and initially to FIG. 1, a digital, microcontroller-based ground-fault circuit interrupter (GFCI) circuit 10 is arranged to sense ground-fault and grounded-neutral conditions on line and neutral conductors 30 and 32, respectively, using a single current transformer T1 as a sensor.

The digital microcontroller U1 is a device such as the PIC12CE673 microntroller, or a digital signal processor or an ASIC device with features such as: on-board RAM, a non-volatile memory, an internal timer, an internal analog-to-digital (A/D) converter and analog and digital ports.

DC power for the GFCI circuit 10 is supplied from a power supply circuit 20, which draws power from the line and neutral conductors 30 and 32, and a reference circuit 22 that produces the required regulated DC voltage levels. The complete power supply consists of a trip solenoid L1, a varistor MOV1, a rectifier CR1, a capacitor C1 a dropping resistor R1, a diode string CR2–CR5, a reference diode CR6, and an output capacitor C3. The trip solenoid L1, the capacitor C1 and the varistor MOV1 perform input filtering and surge limiting. The trip solenoid L1 serves multiple functions by providing input filtering, i.e., a series impedance for surge and noise suppression, as well as a means to open the main contacts (not shown) on a short circuit failure in the power supply or for the intended trip function in case of a detected ground-fault or grounded-neutral condition. The rectifier CR1 rectifies the incoming AC current, and the capacitor C1 provides additional energy storage and suppression of high frequency transients. The voltage-dropping resistor R1 is sized appropriately to maintain enough current to forward bias the diode string CR2–CR6 in the voltage reference circuit 22, plus provide the required operating current for the circuit at the minimum input voltage. The DC voltage level required for operation of the microcontroller and other circuitry is regulated by the diode string CR2–CR6. A reference voltage needed for stable operation of the sensing circuit 24 is provided by CR6 and C3. The capacitor C3 provides a small amount of energy storage under transient conditions. The regulated Vref output is available over an input range of ~66 to ~132 VAC. The output voltage Vref and input range can be adjusted by changing component values, as is well understood by those skilled in the art.

A capacitor C2 and a Silicon Controlled Rectifier (SCR) Q1 perform a trip function. When a fault is detected by the microcontroller U1, the digital output "trip" pin of the microcontroller U1 is set, which turns on the SCR Q1 and creates a current path through the solenoid L1, the rectifier CR1 and the SCR Q1. The resulting current is at a level sufficient to activate the trip solenoid L1 and open the main contacts (not shown). The capacitor C2 provides noise suppression for the gate of SCR Q1 and stores voltage during the trip operation to maintain the "on" state of Q1 for a longer period of time.

A manual test circuit 22 consists of a manual push-to-test switch PTT and a pair of resistors R11 and R12. When the switch PTT is depressed, a sufficient current flow occurs to cause the GFCI circuit 10 to detect a fault and use the trip function to open the main contacts (not shown).

The current-sensing circuit 24 consists of a current transformer T1 coupled to a line conductor 30 and a neutral conductor 32 and an amplifier circuit composed of an operational amplifier U2 and a pair of resistors R7 and R8. A bias voltage resistive divider circuit formed by a pair of resistors R3 and R4, which sets up a circuit voltage that is ½ of Vref. This assures that the "Zero" level of the sensor circuit 24 output sits half way between the rails of the A/D input of the microcontroller U1 to facilitate envelope detection.

The permeability of the current transformer T1 is affected by changes in environmental temperature which are preferably compensated for in both ground-fault and grounded-neutral threshold levels.

An optional, temperature-sensing circuit 26 uses the base-to-emitter voltage of a small-signal bipolar junction transistor Q3 to provide a reading of the ambient temperature conditions near the current transformer T1. The junction bias current of the transistor Q3 is set by a resistor R13 connected to the reference supply voltage Vref. The reference voltage Vref and the voltage at the base of the transistor Q3 are sampled by the microcontroller U1, and the value sampled is used to adjust the ground-fault threshold value and grounded-neutral detection reference value to compensate for changes in the performance of the current transformer T1 over temperature.

During the manufacturing process, the microcontroller may be programmed to calculate the ground-fault and grounded-neutral threshold values at a given temperature and store the threshold values in a non-volatile memory. Another temperature compensation method is discussed below with reference to FIGS. 5 and 6.

An analog, short-term memory circuit 28 consists of a capacitor C6, a load resistor R9 and a bleed resistor R10. The microcontroller U1 uses a bi-directional pin Mem_cap, as an analog input to read the voltage of the memory circuit 28 and as a digital output to charge the capacitor C6 of the memory circuit 28. If a fault is detected, software running in the microcontroller U1 causes a charge to be placed on the capacitor C6. If power is lost before the trip solenoid is able to open the contacts, the trip memory (i.e., voltage on the capacitor C6) will remain for a short time and cause reactivation of the trip function (by the microcontroller U1) upon resumption of supply voltage. The memory circuit 28 allows the GFCI circuit 10 to operate from a half-wave-rectified or other discontinuous power source.

Figure 2:
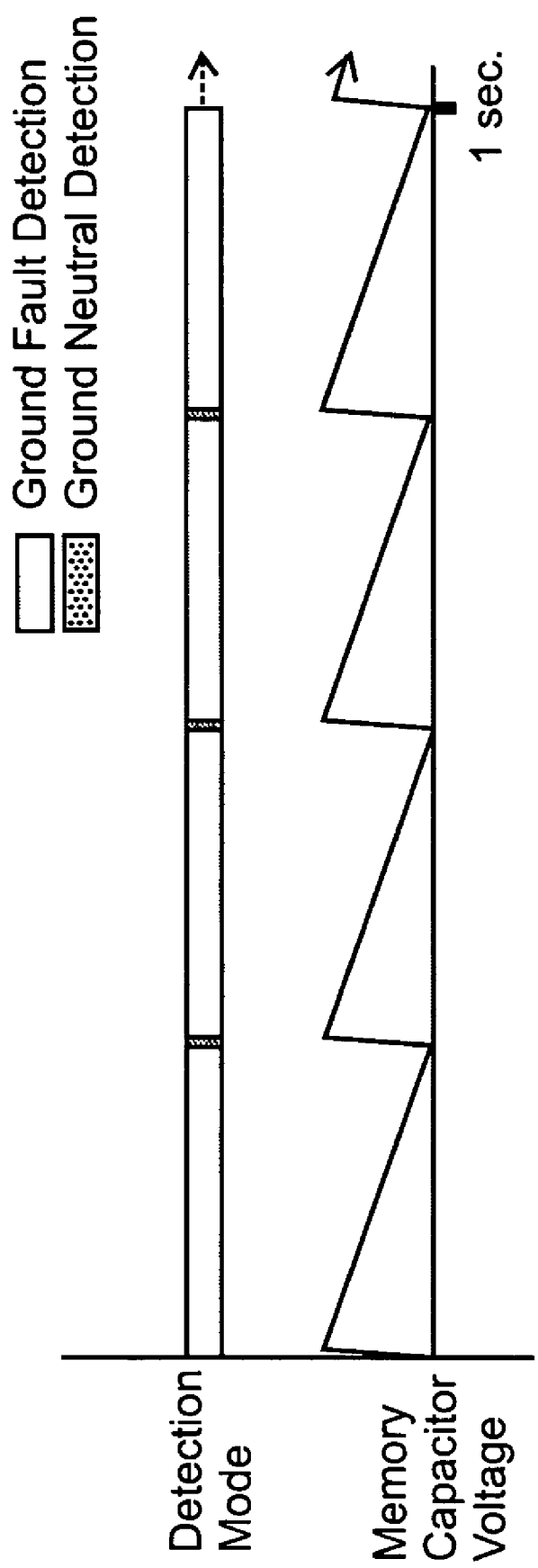
FIG. 2 is timing diagram illustrating the use of the memory capacitor in the circuit of FIG. 1.

Referring now to FIG. 2, the timing diagram shows the use of the analog memory circuit 28 during normal operation (no fault detected), for timing purposes to determine when to execute the grounded-neutral and ground-fault checks. The memory circuit 28 allows the timing of grounded-neutral checks to remain consistent even if a half-wave-rectified (discontinuous) power supply is used. When the voltage of the memory circuit reaches the near-discharged state, the microcontroller U1 charges the capacitor C6 to a voltage level less that the amount required to indicate a pending trip, as discussed above and executes a continuous ground-fault detection mode during the time interval until the voltage capacitor C6 reaches the near-discharged state again. When the voltage of the memory circuit 28, sampled by the microcontroller U1, reaches the near-discharged state, a grounded-neutral check is executed during the intervening time or space interval. This cycle occurs a few times per second as illustrated, and can be adjusted by varying the values of the memory capacitor C6 and the bleed resistor R10.

Figure 3:
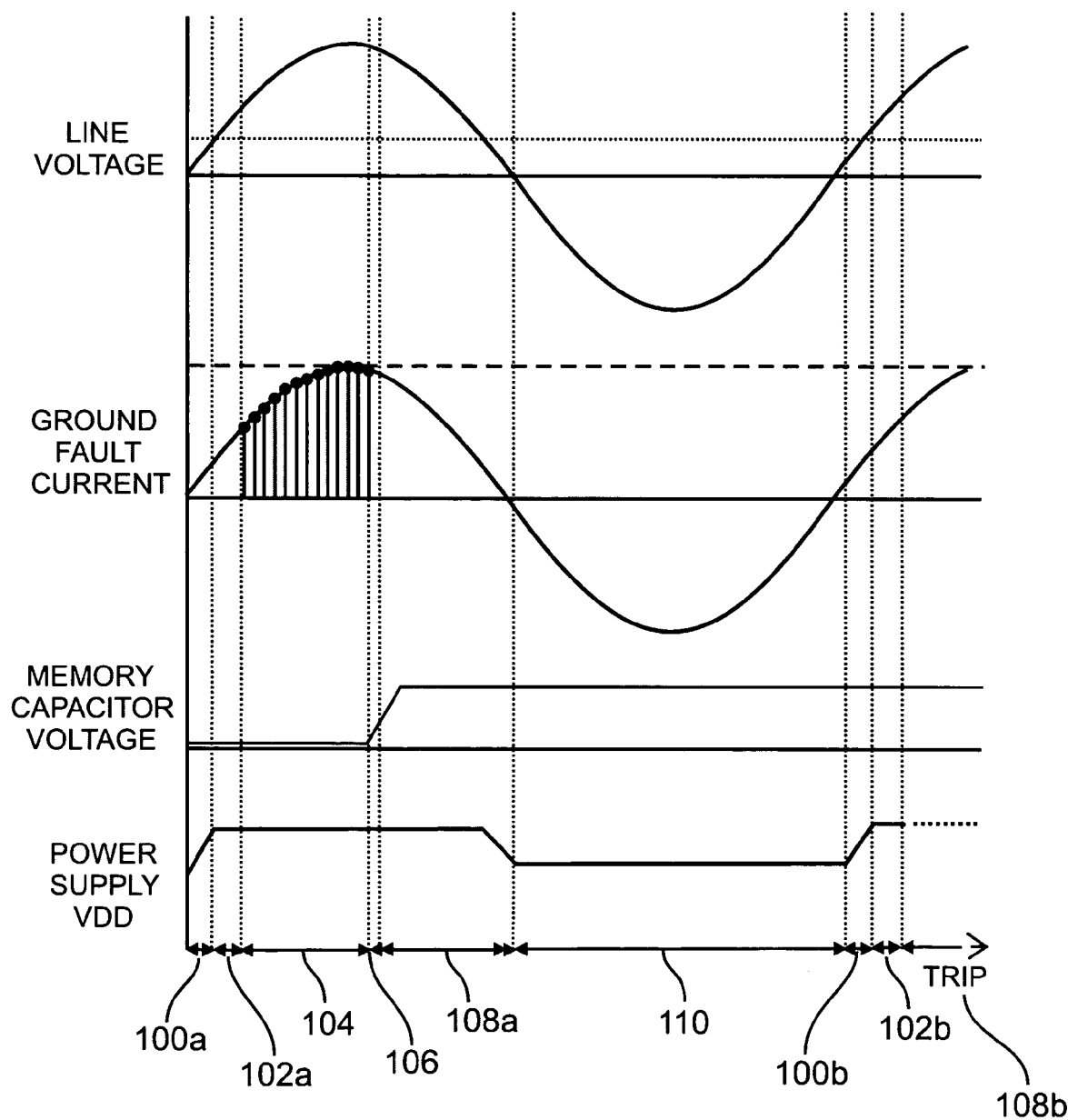
FIG. 3 is a series of waveforms illustrating ground-fault detection with a half-wave power supply.

Turning now to FIG. 3, the operation of ground-fault detection from power-on to a circuit trip based on a half-wave-rectified power supply is illustrated. At 100a the power supply starts up, and at 102a the microcontroller U1 is initialized and the memory capacitor C6 is read to determine if an unfulfilled trip condition exists from a previous cycle as discussed above. At 104 the ground-fault sensing function turns the switch Q2 on, placing the low-impedance burden resistor R6 in the circuit across the secondary of T1. The operational amplifier U2 amplifies the voltage across the resistor R6 to a level that allows 5 mA of ground-fault current to be read by the A/D converter on-board the microcontroller U1. The results are compared in software to a reference ground-fault threshold value to determine if the trip threshold has been exceeded, indicating a fault. If a fault does exist, then at 106 the memory capacitor C6 is charged to indicate a pending trip condition, and at 108a the trip function is activated in an attempt to cause a circuit trip in the time remaining. However, at 110 the half-wave power supply shuts down. At 100b the power supply starts up again, and the microprocessor U1 is re-initialized at 102b, but the charge on memory capacitor C6 indicates a pending trip condition, so the trip function is activated at 108b to cause an immediate circuit trip.

Figure 4:
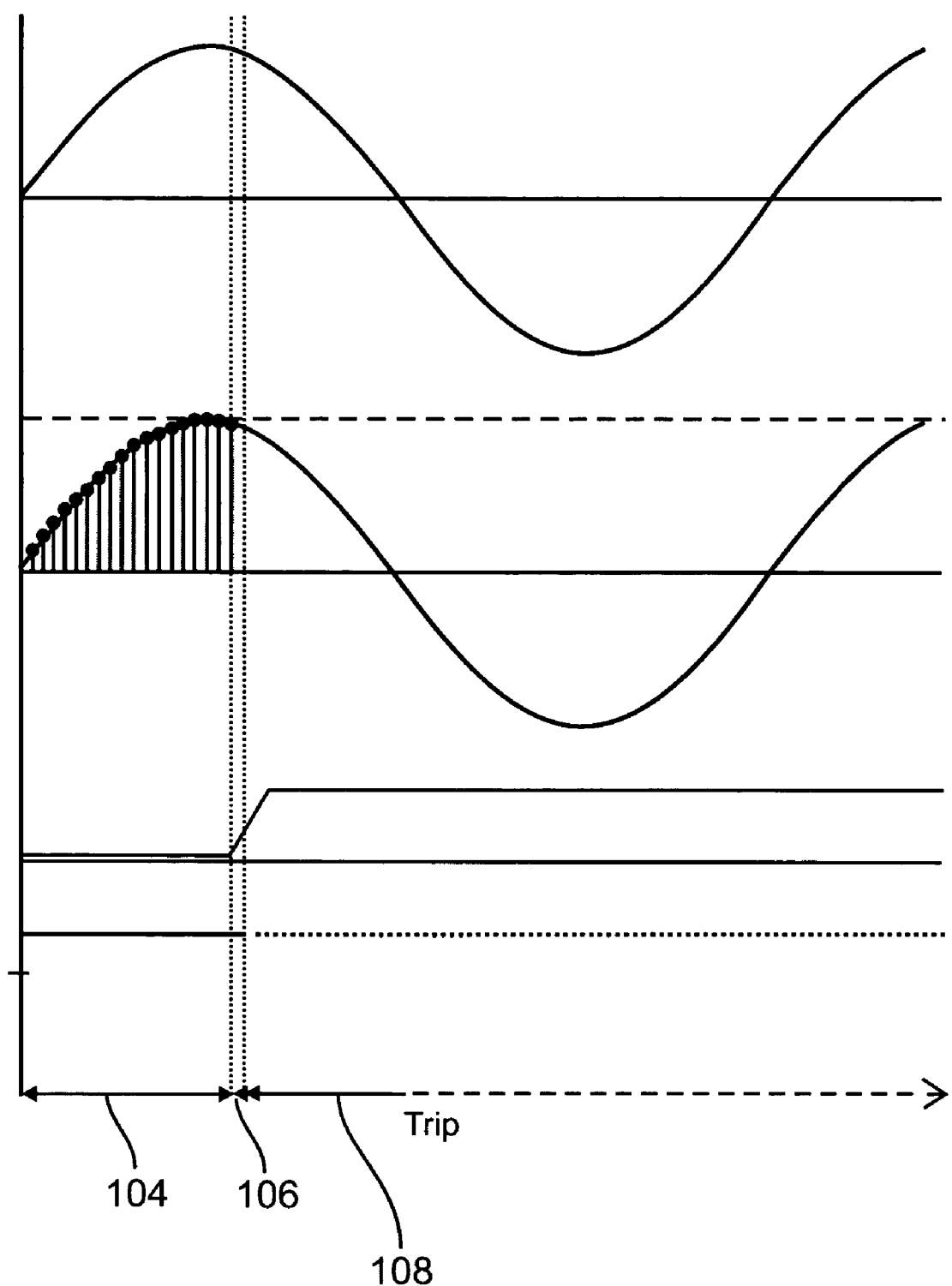
FIG. 4 is a series of waveforms illustrating ground-fault detection with a full-wave power supply.

When powered continuously with a full-wave power supply, as in FIG. 4, circuit tripping may occur more quickly since power is available to activate the trip function during the negative half line cycle as well. Using a full-wave power supply, the startup cycles 100 and 102 of FIG. 3 are only performed once on powerup/reset, and are not shown in FIG. 4. During ground-fault sensing, the microcontroller U1 turns the switch Q2 on, placing the low-impedance burden resistor R6 in the circuit across the secondary of T1. The operational amplifier U2 amplifies this signal to a level that allows 5 mA of ground-fault current to be read by the A/D converter on-board the microcontroller U1. The results are compared in software to a reference ground-fault threshold value to determine if the trip threshold has been exceeded. If a fault does exist, then at 106 the memory capacitor is charged to indicate a pending trip condition, and at 108 the trip function is activated to cause an immediate circuit trip. In case the main line circuit is interrupted before the circuit has tripped, the memory function, for a short time, can aid in performing the trip immediately upon restoration of power.

Figure 5A:
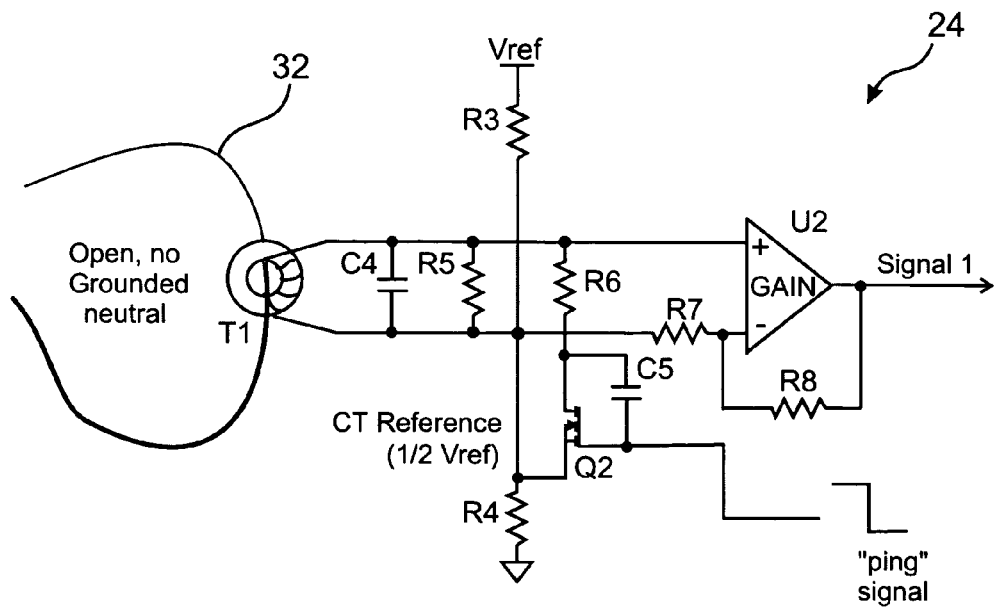
FIGS. 5a and 5b are illustrating the detection of a condition where no grounded-neutral exists.
Figure 5B:
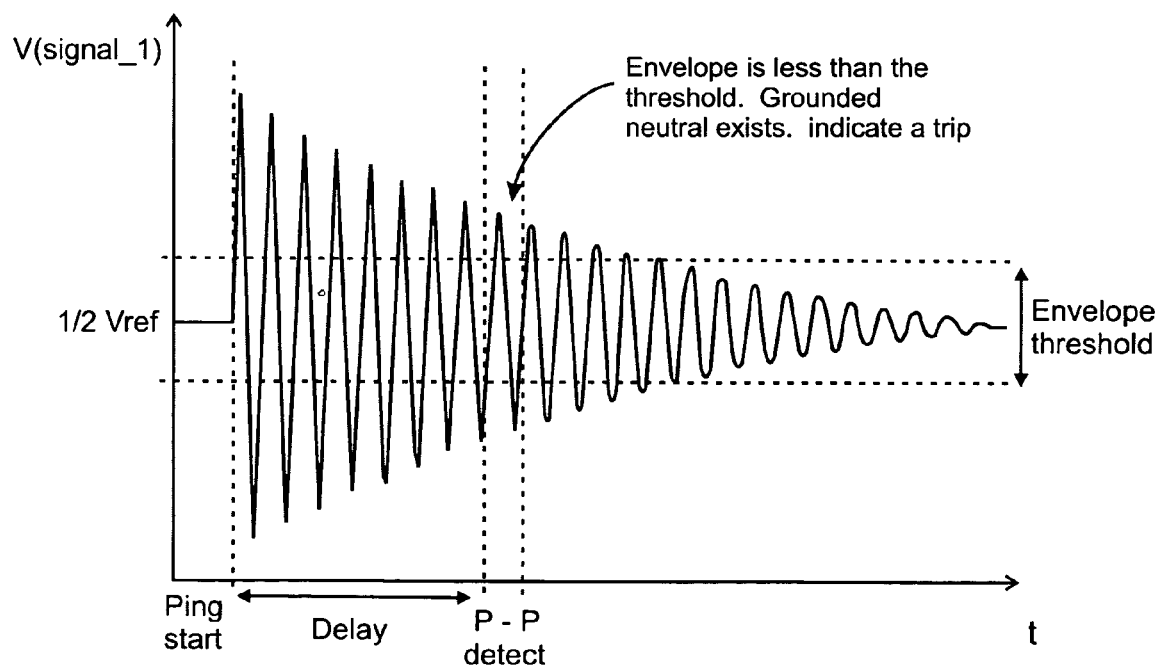
Figure 6A:
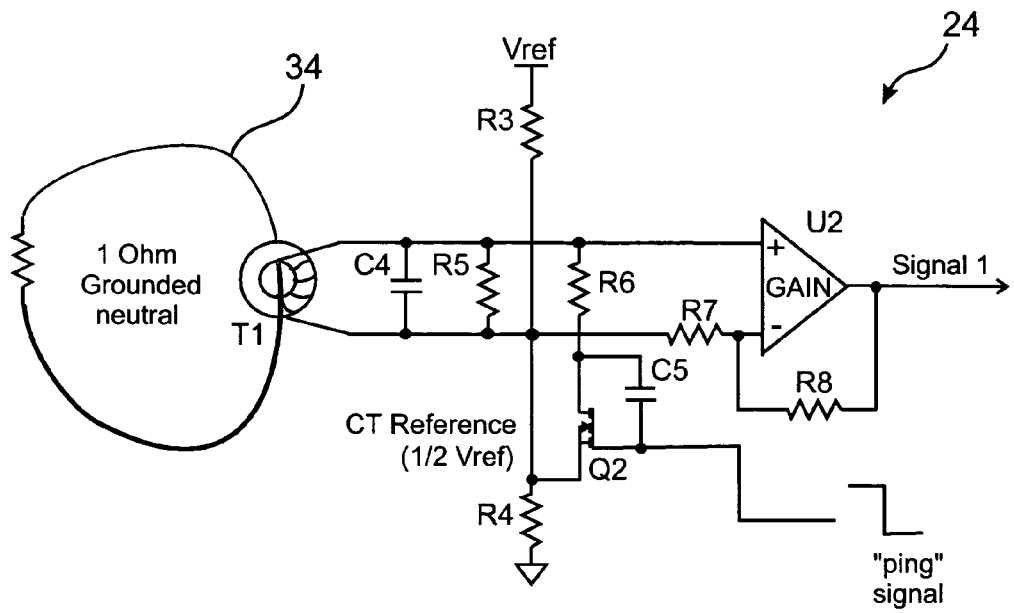
FIGS. 6a and 6b are illustrating the detection of a grounded-neutral condition.

Turning now to FIGS. 5–6, waveforms of the output of the current sense circuit 24 are illustrated for the operation of the grounded-neutral detection function when no grounded-neutral condition exists and when a 1-Ohm grounded-neutral is present, respectively.

Figure 6B:
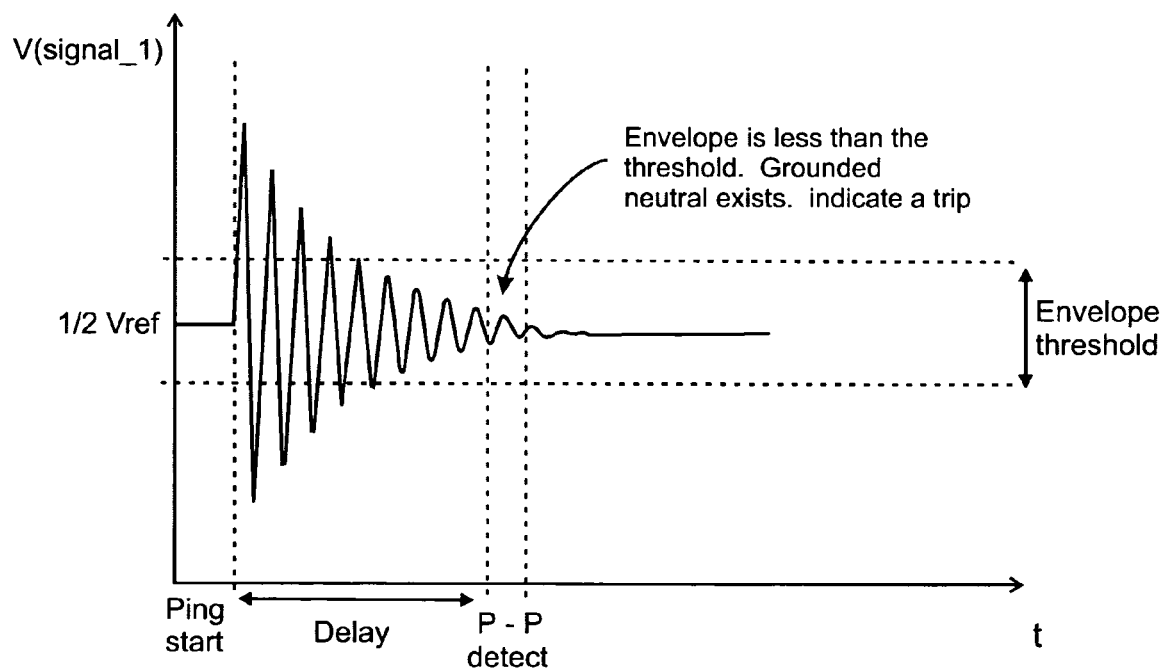

A grounded-neutral detection mode is entered when the voltage on the memory capacitor C6 reaches the near-discharged state. This occurs when the circuit is first powered up and every few hundred milliseconds after that, as determined by the memory circuit 28 for both full-wave and half-wave power supplies. In a grounded-neutral sensing mode, the switch Q2 is turned off by the Ping output of the microcontroller U1, which switches the gate voltage of the switch Q2 from high to low and generates a disturbance on the secondary of the current transformer T1 through capacitor C5. With R6 switched out of the circuit, the secondary of the transformer T1 and the capacitor C4 are allowed to resonate with a small amount of damping provided by the high-impedance burden resistor R5, as shown in FIG. 5b. A grounded-neutral condition changes the impedance of the secondary winding of the transformer T1 and dampens the oscillations sharply, as shown in FIG. 6b. The envelope or peak-to-peak amplitude of the damped oscillatory waveform as it changes with time is amplified by the operational amplifier U2 and measured by the A/D input of the microcontroller U1 after a pre-set delay.

The peak-to-peak amplitude of the waveform, or envelope, measured by the microcontroller U1 is compared to a stored threshold for a grounded-neutral condition. If the peak-to-peak amplitude is greater than the threshold, then the primary impedance is above the grounded-neutral threshold level, e.g., >2.5 Ohms. In this case, the memory capacitor C6 is charged for the next timing interval, the low-impedance burden resistor R6 is switched back into the circuit by the switch Q2, and the software program starts checking for a ground-fault condition. If the measured peak-to-peak amplitude is less than a grounded-neutral threshold value, then a grounded-neutral condition exists, the memory capacitor C6 is charged to indicate a pending trip condition and the trip function is activated. FIG. 6b illustrates the damping effect of a grounded-neutral 34 condition caused by a 1-Ohm grounded-neutral, which causes the envelope of the oscillatory is waveform to decay rapidly, as compared to the envelope illustrated in FIG. 5b, where there is not a grounded-neutral condition.

The aforementioned damped oscillations can be expressed in the form of an exponential equation multiplied by a sinusoid as follows:

$$A \sin(\omega \tau) \times e^{-\alpha t}$$

'A' represents the initial amplitude of the sinusoid, $\omega$ represents the frequency of oscillation, $\tau$ represents time, and $\alpha$ is the decay factor. This $\alpha$ is the combination of the elements that cause the oscillation to decay. The neutral-to-ground resistance is directly related to this $\alpha$. As the neutral-to-ground resistance goes down, $\alpha$ increases, causing the decay to be faster. In order to determine the presence of a predetermined value of neutral-to-ground resistance, this $\alpha$ parameter can be calculated or estimated by a number of methods. Each method offers benefits and compromises in terms of processing requirements and susceptibility to noise. Once estimated, the estimate may be compared to a setpoint for detection of a grounded-neutral fault. Each of the following methods can be implemented with only the positive, negative or both or absolute value of the oscillation cycles. These methods are described below:

Method 1: Envelope of Peaks—Observing that the form of the expression that describes the decaying oscillation contains a sinusoid and an exponential function, this method seeks to find the envelope exponential function. The peaks of the oscillation are located by sampling the signal at a high rate. This peak-to-peak amplitude can be measured to determine the envelope of the waveform. The envelope measured at a specific time from the start of the oscillatory waveform can then be used to measure the decay rate of the exponential function.

Method 2: Polynomial Envelope of Peaks—This method is like Method 1 but uses a second-order estimate of the function in the form $y=Ax^2+Bx+C$. A is used to estimate $\alpha$. A multi-order polynomial could also be used.

Method 3: Linear Envelope Estimate—This method is also like Method 1 except a linear fit of the peak values is found. The resulting slope of the best fit line is used to estimate $\alpha$.

Method 4: Area of Cycles—This method is like Method 1 but uses an estimate of the area below the signal waveform instead of peak values. The resulting points are fit to a model. A parameter of this model is used to estimate $\alpha$. This method could use an exponential, linear or polynomial model as in methods 1, 2 or 3 above.

Method 5: Slope of Half Cycle—This method estimates the slope of the leading or tailing edge of a half cycle by measuring two or more points. The parameter-to-base decisions could be the slope of half cycle N where N is 1, 2, 3, 4 . . .

Method 6: Function of Slope of Half Cycles—This method requires calculation of the slope of M half cycles and then use of a parameter such as the slope of the resulting M half cycle slopes.

Method 7: Threshold on the Slope of Half Cycles—This method requires calculation of the slope of M half cycles and then using a threshold to count the number of half cycles above a preselected threshold. The number of half cycles with a slope above the threshold is used as the decision parameter.

Method 8: Count Peaks Above a Threshold—A fixed number of half cycles or a fixed timer period is monitored. During this time, the number of half cycles that cross above a preselected threshold is counted. A decision parameter based on the number of peaks above the threshold is used.

According to another embodiment of the present invention, the effect of temperature on the performance of the current transformer T1 can be determined, during grounded-neutral fault detection, by measuring the frequency of the damped oscillatory waveform of the current transformer T1. By measuring the resonant frequency with a known value of capacitance, changes in frequency can be related directly to changes in the inductance of the current transformer T1. A change in inductance is a direct indication of a change in permeability in the transformer core material and also relates to the output characteristics of the current transformer T1.

According to one embodiment of the present invention, the microcontroller is programmed, during the manufacturing process at a baseline temperature, to initiate the production of a damped oscillatory waveform to produce a reference frequency value, and store the reference frequency value in non-volatile memory. The reference frequency value obtained is directly related to the inductance of the current transformer T1 at a baseline temperature. During normal operation of the present invention, the reference frequency value is compared to an operationally measured resonant frequency, to calculate modified ground-fault and grounded-neutral threshold values for use in the fault detection process. Thus, changes in the performance of the current transformer T1, over a temperature range, can be made by a resonant frequency observation in lieu of the optional temperature-sensing circuit 26.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A microcontroller-based system for detecting ground-fault and grounded-neutral conditions in an electrical power distribution system having line and neutral conductors comprising:
   a sensor circuit containing a single current transformer producing an output signal responsive to current flow in both the line and neutral conductors of the electrical power distribution system,
   a microcontroller receiving said sensor output signal and initiating the generation of a trip signal upon detection of said ground-fault or said grounded-neutral condition in said power distribution system, said microcontroller being programmed to use said sensor output signal to detect ground-fault conditions during spaced time intervals, and use said sensor output signal to detect grounded-neutral condition during intervening time intervals between said spaced time intervals, a circuit interrupter for interrupting current flow in said power distribution system in response to said trip signal, and a single analog memory circuit operable with both full-wave and half-wave power supplies to provide a timing function to control said spaced time intervals and said intervening time intervals, and a memory function set in response to detection of a ground-fault or grounded-neutral condition to resume a circuit trip if power is temporarily lost before said circuit interrupter activates.

2. A microcontroller-based system for detecting ground-fault and grounded-neutral conditions in an electrical power distribution system having line and neutral conductors comprising:

a sensor circuit containing a single current transformer producing an output signal responsive to current flow in both the line and neutral conductors of the electrical power distribution system, said current transformer having an inductance that varies with temperature.

an ambient temperature sensing circuit placed proximate to said current transformer, producing a voltage which varies linearly with ambient temperature conditions, a programmable microcontroller having a pre-determined ground-fault threshold value and a pre-determined grounded-neutral threshold value stored in a non-volatile memory, said microcontroller being programmed to calculate a modified ground-fault threshold value based on said predetermined ground-fault threshold value and the output of said ambient temperature sensing circuit, calculate a modified grounded-neutral threshold value based on said predetermined grounded-neutral threshold value and the output of said ambient temperature sensing circuit, use said modified ground-fault threshold value to detect a ground-fault condition, use said modified grounded-neutral threshold value to detect a grounded-neutral condition, and initiate the generation of a trip signal upon detection of said ground-fault or said grounded-neutral condition in said power distribution system, and a circuit interrupter for interrupting current flow in said power distribution system in response to said trip signal.

3. A microcontroller-based system for detecting ground-fault and grounded-neutral conditions in an electrical power distribution system having line and neutral conductors comprising:

a sensor circuit providing an output signal, said sensor circuit containing current transformer which has an inductance that varies with temperature and a resonant circuit, a programmable microcontroller containing a pre-determined ground-fault threshold value and a pre-determined grounded-neutral threshold value stored in a non-volatile memory, said microcontroller being programmed to initiate a ping signal to produce a resonant oscillation in said sensor resonant circuit during a grounded-neutral test, measure the frequency of said resonant oscillation to determine a change in the inductance of said current transformer, calculate a modified ground-fault threshold value based on said predetermined ground-fault threshold value and said change in the inductance of said current transformer, calculate a modified ground-fault threshold value based on said grounded-neutral threshold value and said change in the inductance of said current transformer, use said modified ground-fault threshold value to detect said ground-fault condition, use said modified grounded-neutral threshold value to detect said grounded-neutral condition, and initiate the generation of a trip signal upon detection of said ground-fault or said grounded-neutral condition in said power distribution system, and a circuit interrupter for interrupting current flow in said power distribution system in response to said trip signal.

4. A method of detecting ground-fault and grounded-neutral conditions in an electrical power distribution system having line and neutral conductors, comprising:

producing a signal with a single current transformer, responsive to current flow in both the line and neutral conductors of the electrical power distribution system, supplying said signal to a microcontroller that is programmed to use said signal to detect ground-fault or grounded-neutral conditions in said power distribution system and initiate the generation of a trip signal upon detection of said ground-fault or grounded-neutral condition, interrupting the current flow in said power distribution system in response to said trip signal, and using a single analog memory to provide a timing function to control intervals for testing for ground-fault or grounded-neutral conditions, and a memory function set in response to detection of a ground-fault or grounded-neutral condition to resume a trip condition if power is temporarily lost before said current flow in said power distribution system is interrupted.

5. A method of detecting ground-fault and grounded-neutral conditions in an electrical power distribution system having line and neutral conductors, comprising:

producing a signal with a sensor, which varies non-linearly with temperature, responsive to current flow in both the line and neutral conductors of the electrical power distribution system, producing an ambient temperature reading of said sensor, and supplying said signal to a microcontroller having a predetermined ground-fault value and a predetermined grounded-neutral threshold value, said microcontroller being programmed to use said ambient temperature reading to calculate a modified ground-fault threshold value based on said predetermined ground-fault threshold value, use said ambient temperature reading to calculate a modified grounded-neutral threshold value based on said predetermined grounded-neutral threshold value, use said signal to detect ground-fault conditions based on said modified ground-fault threshold value, use said signal to detect grounded-neutral conditions based on said modified grounded-neutral threshold value, initiate the generation of a trip signal upon detection of a ground-fault or grounded-neutral condition, and interrupt the current flow in said power distribution system in response to said trip signal.

6. A method of detecting ground-fault and grounded-neutral conditions in an electrical power distribution system having line and neutral conductors, comprising:

producing a signal responsive to current flow in both the line and neutral conductors of the electrical power distribution system with a sensor containing a resonant circuit and a current transformer having an inductance that varies with temperature, supplying said signal to a microcontroller having a predetermined ground-fault threshold value and a predetermined grounded-neutral threshold value, and said microcontroller being programmed to initiate a ping signal to produce a damped oscillation in a sensor output signal during a grounded-neutral test, measure the frequency of said damped oscillation to determine a change in the inductance of said current transformer, calculate a modified ground-fault threshold value based on said predetermined ground-fault threshold value and said change in the inductance of said current transformer, calculate a modified ground-fault threshold value based on said grounded-neutral threshold value and said change in the inductance of said current transformer, use said modified ground-fault threshold value to detect a ground-fault condition, use said modified grounded-neutral threshold value to detect a grounded-neutral condition, and initiate the generation of a trip signal upon detection of said ground-fault or said grounded-neutral condition in said power distribution system.

* * * * *